(12) United States Patent
Yun et al.

(10) Patent No.: US 7,425,729 B2
(45) Date of Patent: Sep. 16, 2008

(54) LED BACKLIGHT UNIT

(75) Inventors: Hyeong Won Yun, Kyungki-do (KR); Hyun Ho Lee, Kyungki-do (KR)

(73) Assignee: Samsung Electro-Mechanics Co., Ltd., Suwon, Kyungki-do (KR)

( * ) Notice: Subject to any disclaimer, the term of this patent is extended or adjusted under 35 U.S.C. 154(b) by 30 days.

(21) Appl. No.: 11/549,004

(22) Filed: Oct. 12, 2006

(65) Prior Publication Data

US 2007/0081323 A1    Apr. 12, 2007

(30) Foreign Application Priority Data

Oct. 12, 2005    (KR) .................. 10-2005-0096173

(51) Int. Cl.
*H01L 33/00*    (2006.01)
*G02F 1/1335*    (2006.01)

(52) U.S. Cl. .................. 257/98; 257/99; 257/E33.072; 257/E33.075; 349/64; 349/65

(58) Field of Classification Search .................. 257/98, 257/99, E33.057, E33.072, E33.075; 349/61, 349/64, 65

See application file for complete search history.

(56) References Cited

U.S. PATENT DOCUMENTS

2006/0001361 A1*    1/2006    Imai et al. .................. 313/498

\* cited by examiner

*Primary Examiner*—Minh-Loan T Tran
(74) *Attorney, Agent, or Firm*—Lowe Hauptman Ham & Berner

(57) ABSTRACT

An LED backlight unit includes a light source; a board including a circuit pattern printed on an underside thereof, and having at least one mounting hole perforated therein where the light source is inserted; a metal chassis having an inside surface on which an underside of the light source is mounted, and receiving the board to be arranged in parallel to and with a gap from the metal chassis; and a reflector arranged on a top surface of the board to reflect light generated from the light source. The heat radiating path for transferring heat from the light source to the outside can be more simplified to enhance heat radiation efficiency thereby raising product reliability. The number of whole components can be reduced and the board with the light mounted thereon can be replaced with an inexpensive part thereby saving fabrication cost.

11 Claims, 7 Drawing Sheets

LED BACKLIGHT UNIT

CLAIM OF PRIORITY

This application claims the benefit of Korean Patent Application No. 2005-96173 filed on Oct. 12, 2005, in the Korean Intellectual Property Office, the disclosure of which is incorporated herein by reference.

BACKGROUND OF THE INVENTION

1. Field of the Invention

The present invention relates to a backlight unit incorporating LEDs as a light source. More particularly, the LED backlight unit of the invention is designed to radiate heat more efficiently from the light source to the outside, reduce constitutional parts, and utilize an inexpensive product for a board where the light source is mounted.

2. Description of the Related Art

A Cathode Ray Tube (CRT) is one of common display devices used in a monitor of a TV, a measuring instrument, an information terminal and the like. However, the CRT cannot actively respond to compactness and light weight demands of electronics products because of its own weight and size.

The CRT has certain restrictions in weight and size and thus does not satisfy the compactness and light weight trend of various electronic products. Accordingly, some optical devices are expected to replace the CRT, which include a Liquid Crystal Display (LCD) based on electro-optic effects, a Plasma Display Panel (PDP) based on gas discharge, an Electro Luminescence Display (ELD) based on electroluminescence and so on. Among these optical devices, the LCD is being most actively researched.

The LCD has been actively developed to replace the CRT because of its merits such as small size, light weight and low power consumption. Recently, development has been made to such a level that the LCD can sufficiently act as a flat-panel display, and thus is being used for a monitor of a lap-top computer, a desk-top computer and a large-area information display. Accordingly, demands for the LCD are continuously in the rise.

Most of such LCDs display images by adjusting the amount of light received from outside and thus need an external light source such as a backlight unit to irradiate light onto an LCD panel.

The backlight unit acting as a light source of the LCD utilizes a cylindrical lamp or Light Emitting Diodes (LEDs). The LED is typically a semiconductor device which produces minority carriers (e.g., electrons or holes) by using a pn junction structure of a semiconductor and then re-combines the carriers to generate light.

In particular, owing to the compactness and slimness trend of information communication devices, various components such as a resistor, capacitor and noise filter are getting more miniaturized. The LEDs adopted as a light source in the backlight unit are also mounted onto a Printed Circuit Board (PCB) via surface mounting or by using lead frames.

In the meantime, the LED backlight unit is classified into a side emitting type and a top emitting type according to light emitting mechanisms.

FIG. 1 is a sectional view of a side-emitting backlight unit with conventional lead-frame type LEDs installed therein. Referring to FIG. 1, the backlight unit 10 includes a lead-frame type LEDs 11 each functioning as a light source, a Metal Core Printed Circuit Board (MCPCB) 12 including a metal member of excellent heat conductivity, a light guide plate 13 for refracting light beams incident from the LEDs 11 to produce a surface light source, a diffuser sheet 14 for diffusing the light beams received from the light guide plate 13 and an LCD panel 15.

Each of the LEDs 11 has lead frames 11a, which are electrically connected to a circuit pattern on the MCPCB 12 via soldering, and a heat conducting member 11b mounted on the MCPCB 12 to serve as heat radiating means. The MCPCB 12 is mounted on a metal chassis 16 with a heat conducting pad 16a interposed therebetween.

A reflector 17 is arranged between the light guide plate 13 and the MCPCB 12 to be parallel with a wall (not shown) extending from the metal chassis 16 in order to reflect light beams generated from the LEDs 11. The reflector 17 has holes 17a perforated for receiving the LEDs 11 without any interference.

FIG. 2 is a sectional view of a top-emitting backlight unit with conventional surface mounting LEDs installed therein. Referring to FIG. 2, the conventional backlight unit 20 includes surface-mounted LEDs 21 each functioning as a light source, an MCPCB 22 including a metal member of excellent heat conductivity, a diffuser sheet 24 for diffusing the light beams received from the LEDs 21 and an LCD panel 25.

Each of the LEDs 21 has leads 21a or electrode terminals, which are electrically connected to a circuit pattern on the MCPCB 22 via soldering, and a heat conducting member 21b mounted on the MCPCB 22 to function as heat radiating means. The MCPCB 22 is mounted on a metal chassis 26 with a heat conducting pad 26a interposed therebetween.

The backlight unit 20 also includes a reflector 2 coated on the top surface of the MCPCB 22. The reflector 2 is made of a reflecting material to reflect light beams incident from the LEDs 21.

In FIGS. 1 and 2, the reference signs 14a and 24a designate a Dual Brightness Enhancement Film (DBEF), and 14b and 24b designate a Brightness Enhancement Film (BEF).

However, in the conventional LED backlight units 10 and 20 as above, since heat generated from the LED 11, 21 is radiated through a path consisting of the heat conducting member 11b, 21b, the MCPCB 12, 22, the heat conducting pad 16a, 26a and the metal chassis 16, 26, the path has a number of interferences between different materials. Then, the efficiency of outwardly radiating high-temperature heat becomes poor in comparison to a case where the heat conducting member 11b directly contacts the metal chassis 16. This as a result accelerates deterioration of the LED package thereby shortening its lifetime and degrading heat radiating characteristics of the backlight units 10 and 20.

Furthermore, a large number of parts are used to make the backlight unit 10, 20. It is also difficult to fixedly locate the reflector 17 having the hole 17a on the wall of the metal chassis 16 or to coat a reflective material on the MCPCB 22 excluding those areas where the LED 21 and other devices are mounted and where the circuit pattern is printed to form a reflector 27. Thus, these problems disadvantageously increase the manufacturing cost of the backlight unit.

Moreover, the MCPCB 12, 22 with the LED 11, 21 mounted thereon is an expensive board having a metal member of excellent heat conductivity, and thus acts as another factor of increasing the manufacturing cost of the backlight unit.

SUMMARY OF THE INVENTION

The present invention has been made to solve the foregoing problems of the prior art and therefore an object of certain embodiments of the present invention is to provide an LED backlight unit capable of radiating heat from a light source to the outside along a simplified path in order to raise heat radiation efficiency.

Another object of certain embodiments of the invention is to provide an LED backlight unit by which the number of constitutional components can be reduced and a board with a light source mounted thereon can be replaced by an inexpensive component.

According to an aspect of the invention for realizing the object, the invention provides an LED backlight unit. The LED backlight unit includes a light source; a board including a circuit pattern printed on an underside thereof, and having at least one mounting hole perforated therein where the light source is inserted; a metal chassis having an inside surface on which an underside of the light source is mounted, and receiving the board to be arranged in parallel to and with a gap from the metal chassis; and a reflector arranged on a top surface of the board to reflect light generated from the light source.

Preferably, the light source includes a light emitting chip for generating light when a supply voltage is applied thereto, a heat conducting member with the light emitting chip seated on a top surface thereof, a lead electrically connected to the light emitting chip and a molding for integrally holding the heat conducting member and the lead.

More preferably, the heat conducting member comprises a heat conductive metal exposed through an underside surface of the molding to be mounted on the inside surface of the metal chassis.

Preferably, the lead comprises a lead terminal of a redetermined length with one end connected to the light emitting chip and the other end bent upward to be connected to the circuit pattern of the board.

More preferably, the lead comprises an electrode terminal with one end connected to the light emitting chip and the other end connected to the circuit pattern on the underside of the board and exposed through an upper surface of the molding.

More preferably, the molding has a step formed in an upper outer periphery to be fitted into the mounting hole.

Preferably, the LED backlight unit further includes a lens arranged on an upper portion of the molding.

Preferably, the reflector comprises a reflective material coating of a predetermined thickness arranged on an upper surface of the board opposite to the underside thereof where the circuit pattern is printed.

Preferably, the reflector comprises a reflective material deposition of a predetermined thickness arranged on an upper surface of the board opposite to the underside thereof where the circuit pattern is printed.

As an alternative, the reflector comprises a reflective material printing of a predetermined thickness arranged on an upper surface of the board opposite to the underside thereof where the circuit pattern is printed.

As another alternative, the reflector comprises a reflective sheet bonded via adhesive onto an upper surface of the board opposite to the underside thereof where the circuit pattern is printed.

Preferably, the LED backlight unit further includes a liquid crystal display panel a diffuser sheet above the light source.

More preferably, the LED backlight unit further includes a light guide plate between the light source and the diffuser sheet.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

The present invention will now be described more fully hereinafter with reference to the accompanying drawings, in which preferred embodiments of the invention are shown.

Figure 1:
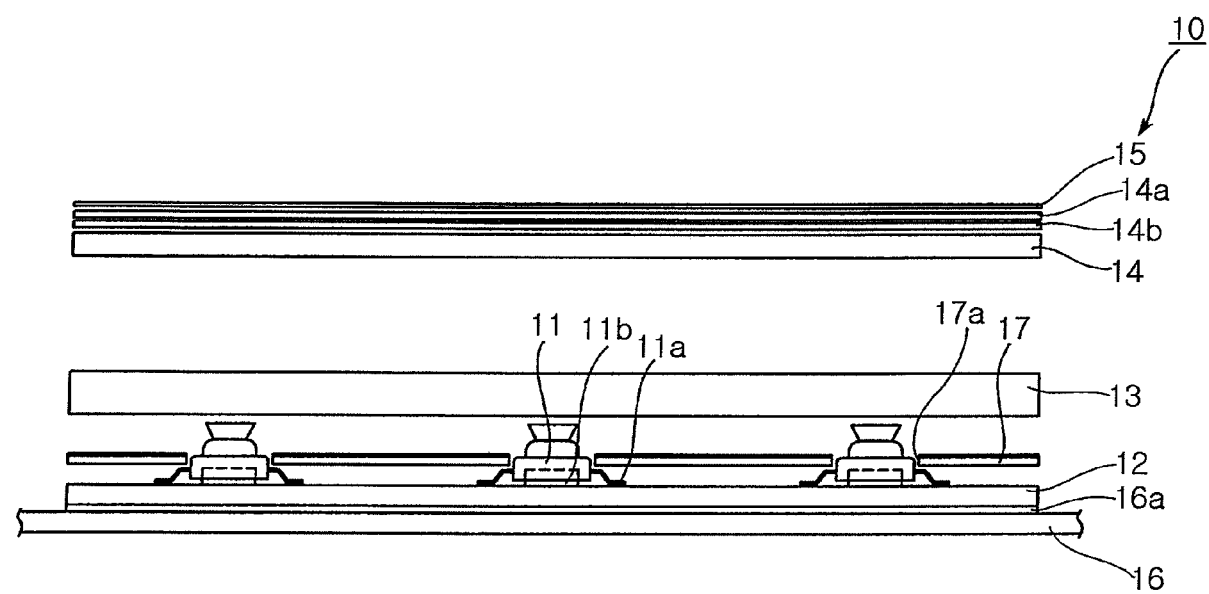
FIG. 1 is a sectional view of a side-emitting backlight unit with conventional lead-frame type LEDs installed therein.
Figure 2:
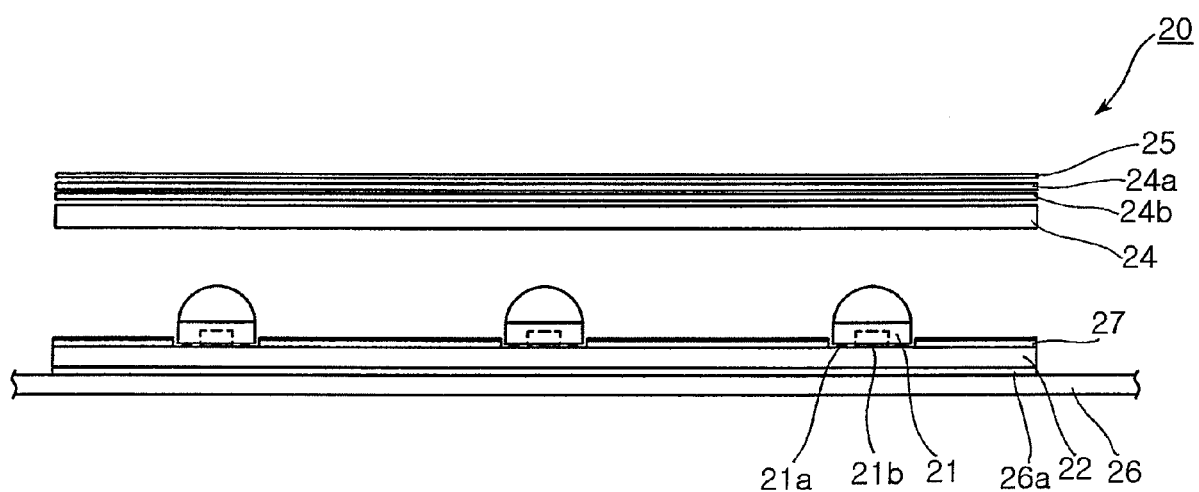
FIG. 2 is a sectional view of a top-emitting backlight unit with conventional surface mounting LEDs installed therein.
Figure 3:
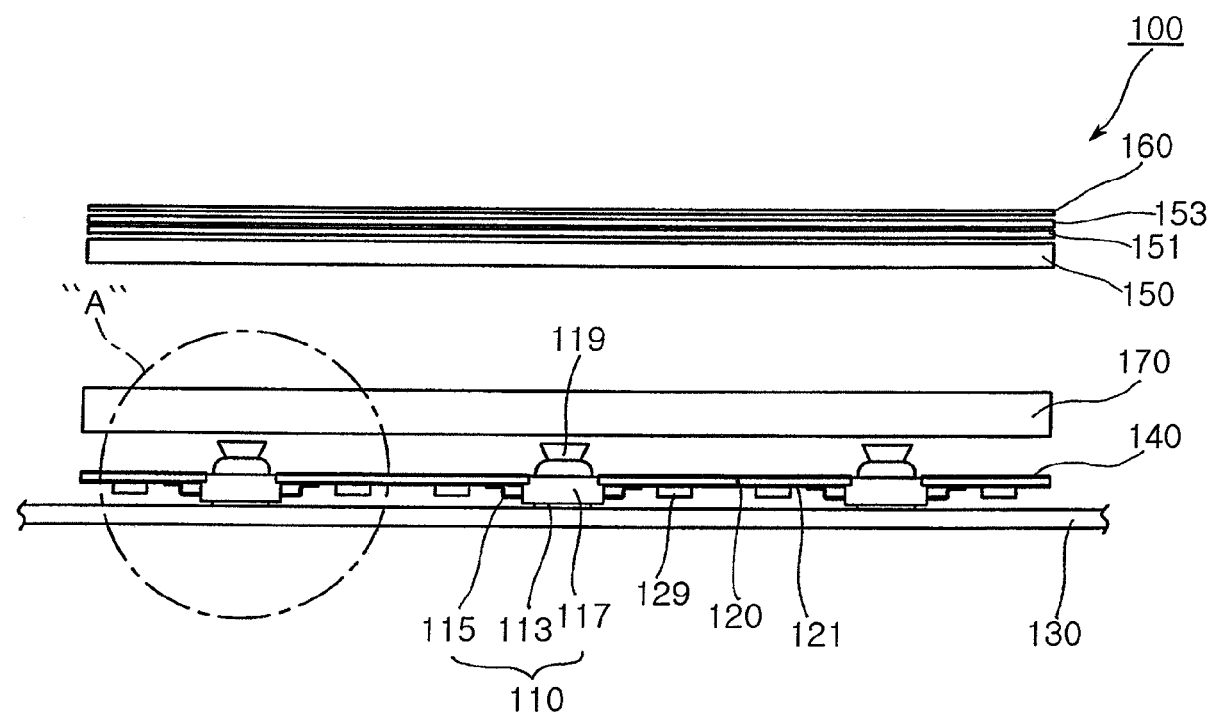
FIG. 3 is a sectional view of an LED backlight unit according to a first embodiment of the invention.
Figure 4:
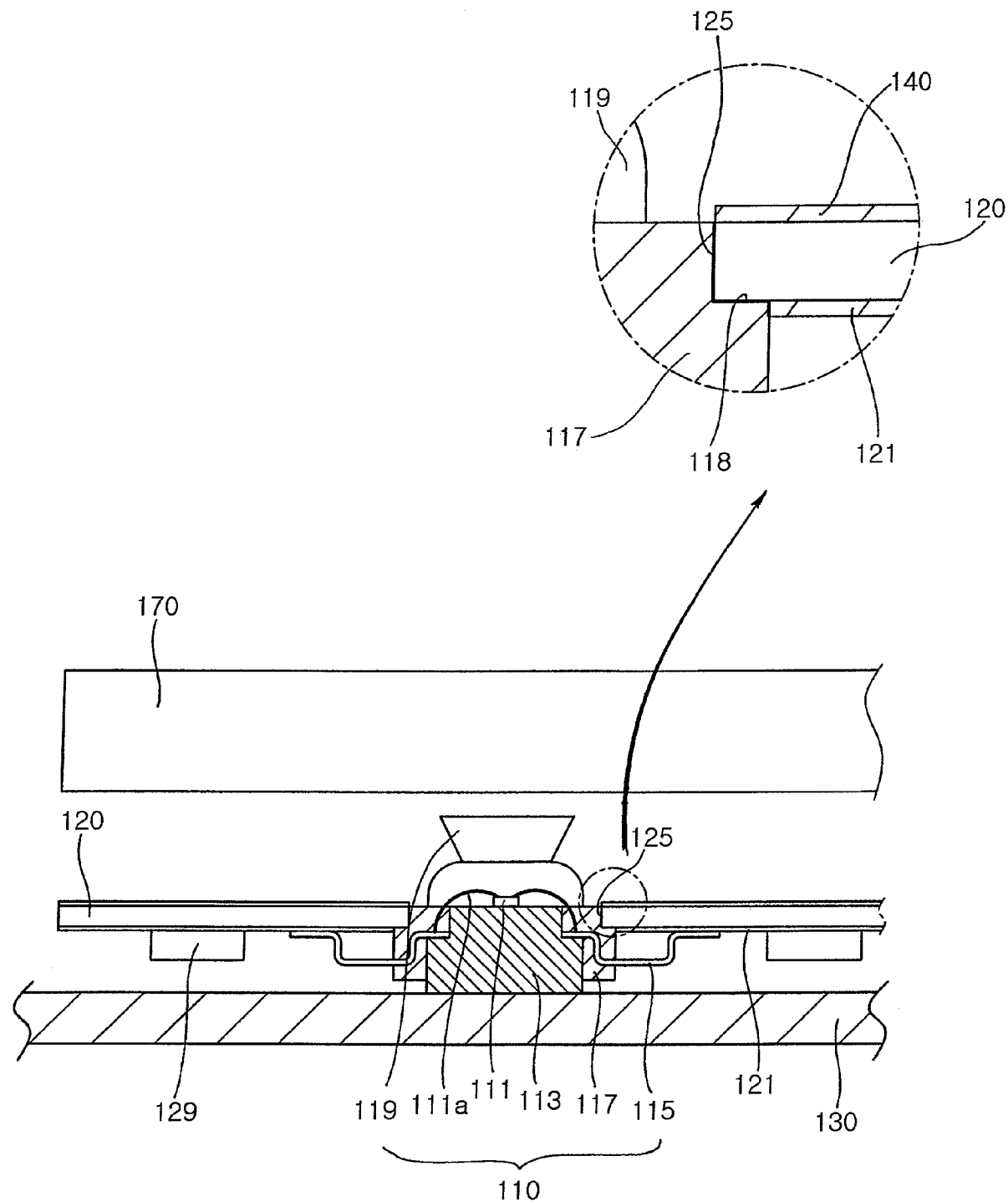
FIG. 4 is a detailed view of A part in FIG. 3.
Figure 5:
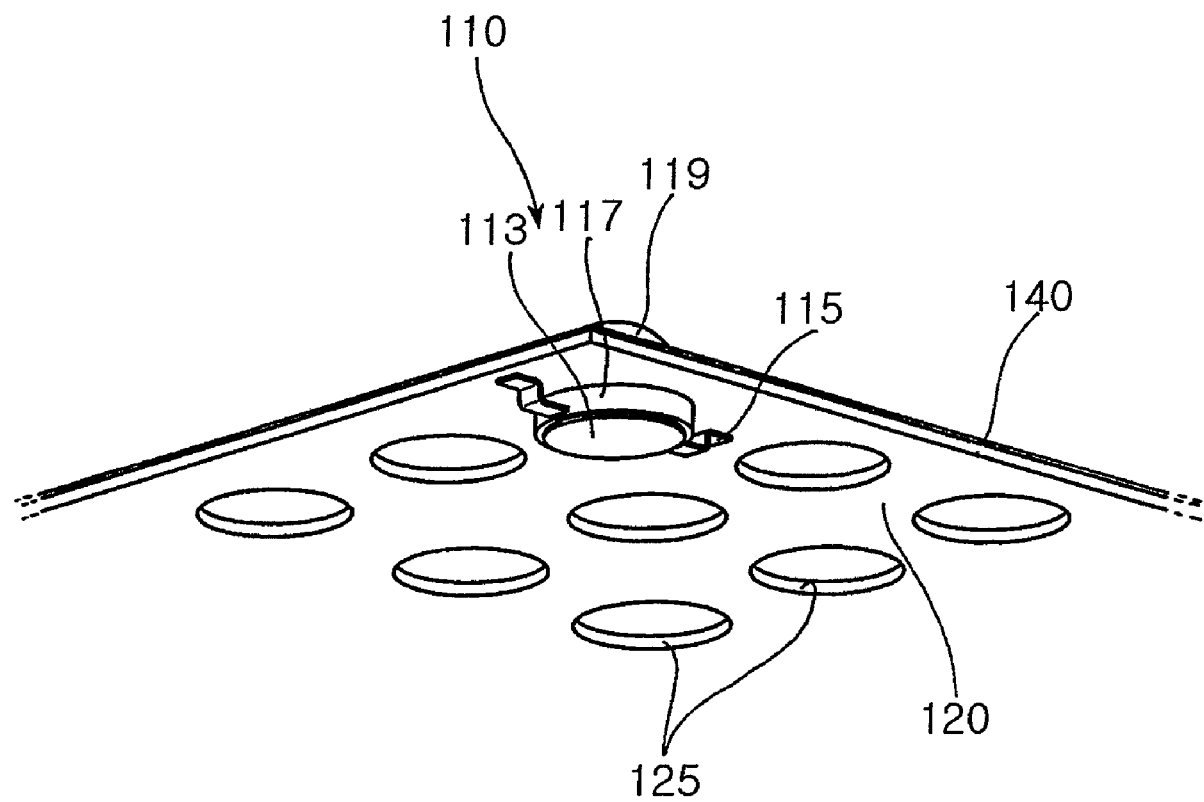
FIG. 5 is a perspective view of light sources of the LED backlight unit according to the first embodiment of the invention, which are assembled to a board.

FIG. 3 is a sectional view of an LED backlight unit according to a first embodiment of the invention, FIG. 4 is a detailed view of A part in FIG. 3, and FIG. 5 is a perspective view of light sources of the LED backlight unit according to the first embodiment of the invention, which are assembled to a board.

Referring to FIGS. 3 to 5, the LED backlight unit 100 of the invention includes light sources 110 capable of affording light beams to an LCD unit, a board 120, a metal chassis 130 and a reflector 140.

That is, each of the light sources 110 includes a light emitting chip 111, a heat conducting member 113, leads 115 and a molding 117. The light emitting chip 111 is a Light Emitting Diode (LED) adapted to generate light and heat when applied with supply voltage.

Here, the light emitting chip 111 is made by using any of semiconductor materials including but not limited to GaAlAs, AlGaIn used for a red semiconductor laser device of a high density optical disk, AlGaInP, AlGaInPAs and GaN used for an electronic device such as a transistor, which are composed of an active area and cladding layers surrounding the same.

The heat conducting member 113 is adapted to seat the light emitting chip 11 thereon and composed of a metal of excellent heat conductivity. Thus, the heat conducting member 113 serves as heat radiating means for conducting heat to the outside when the light emitting chip 111 generates light. The heat conducting member 113 is also called "heat sink slug." More preferably, the heat conducting member 113 is made of Cu, Ag, Al, Fe, Ni, W and alloys thereof. Optionally, the heat conducting member 113 may be coated or plated at the outer surface with Ni, Ag, Au and alloys thereof.

The heat conducting member 113 is bonded at the underside to the inside surface (upper surface) of the metal chassis 130 via heat conductive adhesive so as to form a heat radiation path for radiating heat from the light emitting chip 111 to the outside through the metal chassis 130.

Here, the underside of the heat conducting member 113 is shaped to be exposed or protrude to the outside from the underside of the molding 117 corresponding to the inside surface of the metal chassis 130 when the molding 117 is produced or molded.

The leads 115 are conductors fixed to the molding 117 to be electrically connected to the light emitting chip 111 via metal wires 111a.

Each of the leads 115 is a lead terminal which has one end connected to the light emitting chip 111 and the other end bent upward and connected to a circuit pattern 121 of the board 120 so that the light source 110 can be mounted on the board 120 to make a lead-frame type assembly.

The molding 117 is a molded from a resin to hold the heat conducting member 113 and the leads 115 together while exposing the heat conducting member 113 and the leads 115 to the outside.

A lens 119 may be provided on the top of the molding 117, which is designed to further widen or concentrate the beam angle of light emitted from the light emitting chip 111.

The circuit pattern 121 for electrically connecting to the leads 115 of the light source 110 is printed on the underside of the board 120, and the board 120 is perforated with at least one mounting hole 125 of a predetermined size for receiving and mounting the molding 117 of the light source 110.

Here, the molding 117 may be provided with a step 118 in an upper outer periphery thereof, which is inserted into the mounting hole 125. The step 118 serves to control the degree of insertion when the outer periphery of the molding 117 is fitted into the inner periphery of the mounting hole 125.

The metal chassis 130 is a receiver having an inner space of predetermined size for receiving the board 120 with the light sources 110 assembled thereto.

The underside of the heat conducting member 113 exposed out of the molding 117 of the light source 110 is mounted on the inside surface of the metal chassis 130 via heat conductive adhesive.

As a result, most heat generated from the light source 110 is radiated to the outside through the heat conducting member 113 and the metal chassis 130.

The board 120 is horizontally arranged in parallel to and with a gap G from the inside surface of the metal chassis 130 where the heat conducting member 114 is mounted. Here, the gap G between the underside of the board 120 and the inside surface of the metal chassis 130 is preferably larger than the mounting height H of devices 129 mounted on the underside of the board 120.

The outer periphery of the board 120 is assembled to side walls of the metal chassis 130 to be parallel with the inside surface of the metal chassis 130 by using assembling means (not shown). The assembling means are preferably manufactured of a material and structure having excellent heat conductivity in order to radiate heat from the light source 110 to the outside through the board 120 and the metal chassis 130.

The reflector 140 is provided integrally to the top surface of the board 120 to forwardly reflect light generated from the light source 110.

The reflector 140 is provided on the entire top surface of the board 120 where the pattern circuit 121 is not printed, by coating, depositing or printing high reflectivity material at a uniform thickness. Examples of the high reflectivity material include but not limited to Al, Ag, Pt, Ti, Cr and Cu. As an alternative, a reflector plate or sheet made of a high reflectivity material such as Al, Ag, Pt, Ti, Cr and Cu may be bonded onto the top surface of the board 120.

A diffuser sheet 150 and an LCD panel 160 are also provided above the light sources 110, and optionally and preferably a Brightness Enhancement Film (BEF) 151 and a Dual Brightness Enhancement Film (DBEF) 153 may be stacked on each other between the diffuser sheet 150 and the LCD panel 160 to enhance brightness characteristics.

In a case where the backlight unit 100 is provided in a side emitting type, a light guide plate 170 may be provided between the light sources 110 and the diffuser sheet 150 to reflect light beams incident from the light sources 110 to produce a surface light source.

Figure 6:
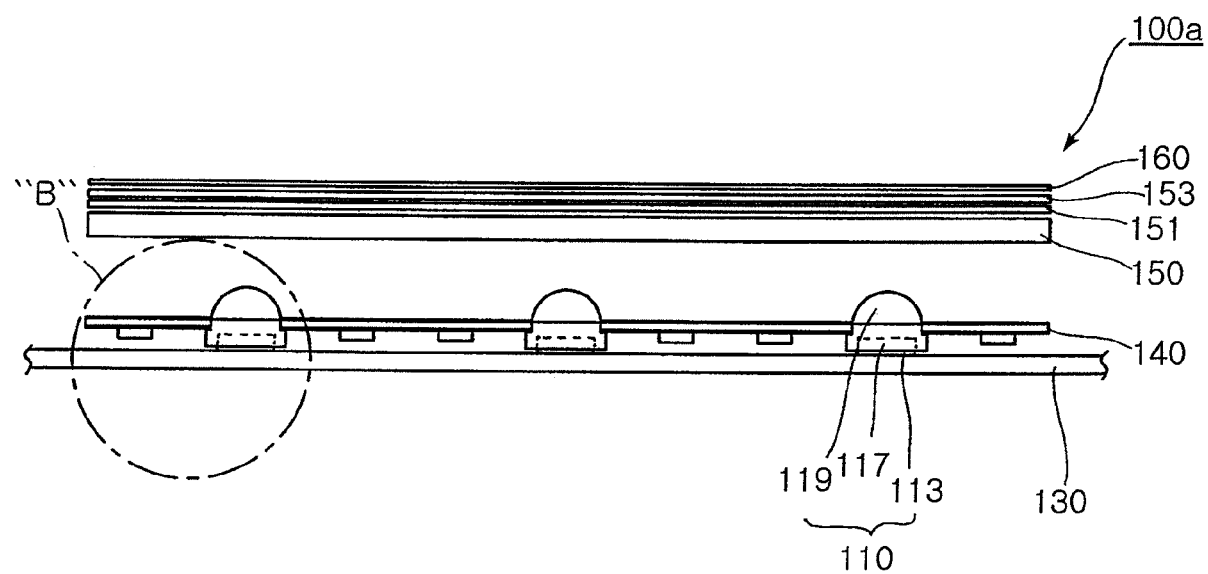
FIG. 6 is a sectional view of an LED backlight unit according to a second embodiment of the invention.
Figure 7:
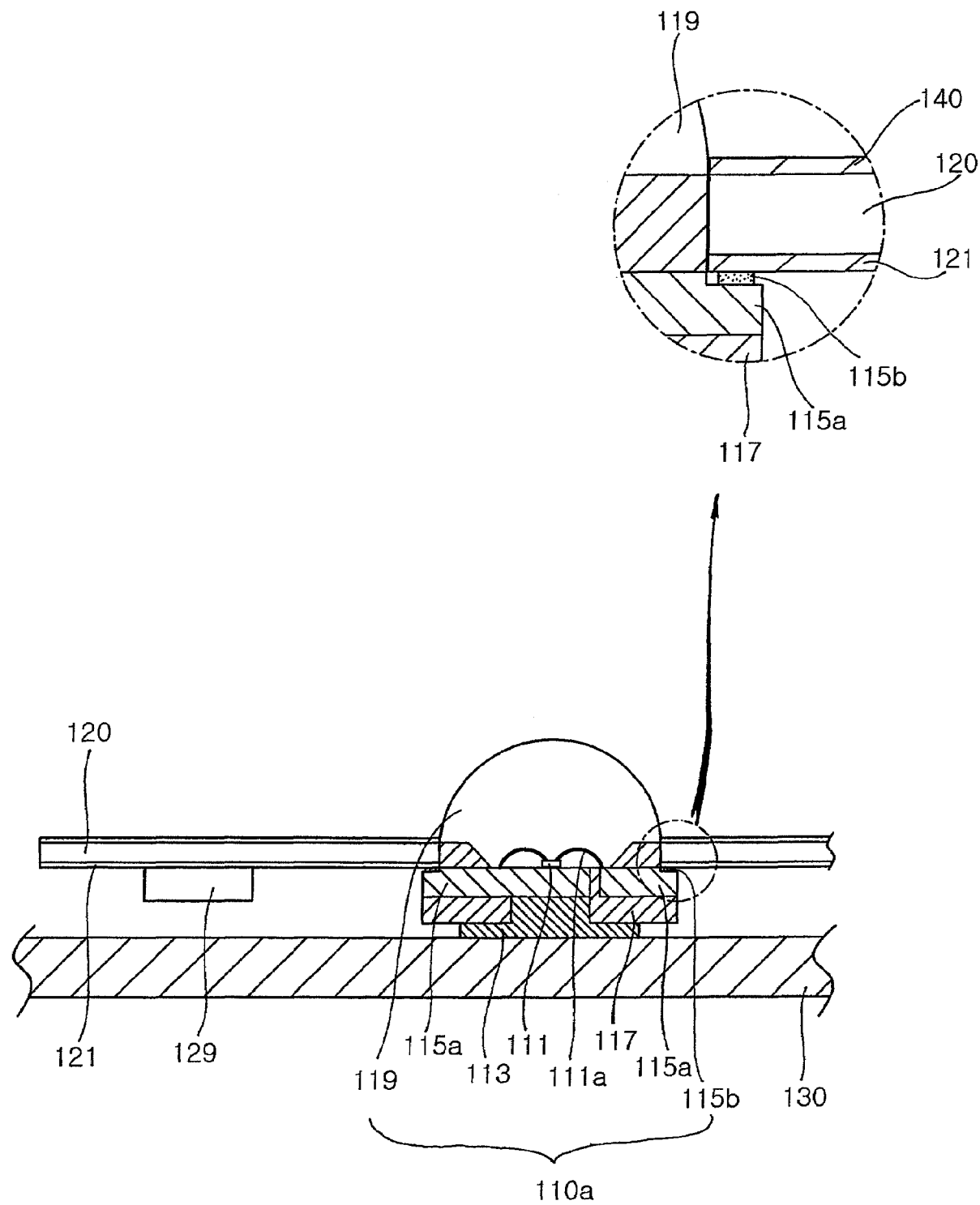
FIG. 7 is a detailed view of B part in FIG. 6.

FIG. 6 is a sectional view of an LED backlight unit 100a according to a second embodiment of the invention, and FIG. 7 is a detailed view of B part in FIG. 6.

Referring to FIGS. 6 and 7, the LED backlight unit 100a of the invention includes light sources 110a, a board 120, a metal chassis 130 and a reflector 140, in which the same components are designated with the same reference signs as in the first embodiment and detailed descriptions thereof will be omitted.

In the LED backlight unit 100a shown in FIGS. 6 and 7, the lead 115a is provided as an electrode terminal electrically connected to the light emitting chip 111 via the wire 111a in which the other end is exposed through an upper surface of the molding 117 to be electrically connected to the circuit pattern 121 formed on the underside of the board 120 so that the light source 110a can be surface-mounted on the board 120.

In such a case, the electrode terminal or lead 115a of the light source 110a is bonded to the circuit pattern 121 via solder 115b to supply external voltage to the light emitting chip 111.

In addition, the outside diameter of the molding 117 with the electrode terminal is formed larger than the inside diameter of the mounting hole 125 to enable controlled insertion of the light source 110a into the mounting hole 125.

The LED backlight units 100 and 100a as described above will be fabricated according to a following process. As shown in FIGS. 3 to 7, the board 120 is prepared from an epoxy-based FR4 PCB or FPCB which does not contain heat conducting metal unlike the conventional MCPCB 16 or 26, and perforated with the mounting hole 125 at a predetermined size.

In addition, a number of devices 129 are mounted on predetermined locations of one side of the board 120 where the circuit pattern 121 is printed.

Then, a reflective material of high optical reflectivity is provided at a uniform thickness on the other side of the board 120 where the devices 129 are not mounted, via coating, deposition or printing, thereby forming a reflector 140 having a reflective surface. As an alternative, the reflector 140 may be provided by bonding a reflecting sheet or plate on the board 120.

Here, the step of forming the reflector 140 on the board 120 may be carried out before mounting the devices 129 on the board 120.

Next, the board 120 is placed in such a fashion that the reflector 140 faces upward along the light emission direction while the circuit pattern 121 and the devices 129 face downward. Then, the light source 110 having the lead terminals bent upward is mounted on the board 120 in a lead-frame type to produce the side-emitting type backlight unit 100. As an alternative, the light source 110a having the electrode terminals is surface-mounted on the board 120 to produce the top-emitting type backlight unit 100a.

That is, the light source 110 having the lead terminals or the light source 110a having the electrode terminals is arranged directly under the mounting hole 125 and then pushed upward through the mounting hole 125 to insert the molding 117 into the mounting hole 125, thereby achieving first fixing.

Here, in a case where the step 118 is formed in the upper outer periphery of the molding 117 as shown in FIG. 4, the degree of insertion of the light source 110 is controlled by the interference between the step 118 and the underside of the board 120, and the light emitting chip 111 and the lens 119 of the light source 110 are exposed to the outside through the mounting hole 125.

On the other hand, in a case where the step is formed between the molding 117 and the lens 119 as shown in FIG. 7, the degree of insertion of the light source 110a into the mounting hole 125 is controlled by the interference between the step and the board 120, and the light emitting chip 111 and the lens 119 of the light source 110 are exposed to the outside through the mounting hole 125 as stated above.

Then, free ends of the lead terminals extending outward and bent upward from the molding 117 are placed to correspondingly contact the circuit pattern 121 on the underside of the board 120 and bonded to the circuit pattern 121 via solder, thereby electrically connecting the light source 110 to the board 120 and second-fixing the light source 110 which is first fixed to the mounting hole 125.

On the other hand, free ends of the electrode terminals exposed through the upper surface of the molding 117 are placed to correspondingly contact the circuit pattern 121 on the underside of the board 120 and bonded to the circuit pattern 121 via solder, thereby electrically connecting the light source 110a to the board 120 and second-fixing the light source 110a which is first fixed to the mounting hole 125.

Furthermore, in the light source 110 or 110a mounted on the board 120, the underside of the heat conducting member 113 exposed out of the molding 117 is bonded to the inside surface of the metal chassis 130 via heat conducting adhesive to radiate high-temperature heat from the light source 110 to the outside through the heat conducting member 113 and the metal chassis 130.

The board 120 is assembled at the outer periphery to the vertical side wall extending from the metal chassis by using separate assembling means (not shown).

In addition, the light guide plate 170 is arranged directly above the light source 110 in the metal chassis 130, the diffuser sheet 150 and the LCD panel 160 are arranged on the top of the metal chassis 130, and the BEF 151 and the DBEF 153 are stacked between the diffuser sheet 150 and the LCD panel 160 to enhance brightness characteristics.

According to the present invention as set forth above, since the heat conducting member of the light source inserted into the mounting hole of the board and exposed downward is mounted on the inside surface of the metal chassis, the heat radiating path for transferring heat from the light source to the outside can be more simplified than in the prior art. This as a result can enhance the heat radiation efficiency of the light source and prevent deterioration thereby raising product reliability.

Furthermore, since the board with the light source mounted thereon is arranged with a gap apart from the inside surface of the metal chassis and the reflector is provided integrally onto the board, the number of whole components can be reduced than in the prior art and the inexpensive board can replace expensive boards of the prior art. As a result, fabrication process can be simplified and fabrication cost can be remarkably saved.

While the present invention has been described with reference to the particular illustrative embodiments and the accompanying drawings, it is not to be limited thereto but will be defined by the appended claims. It is to be appreciated that those skilled in the art can substitute, change or modify the embodiments into various forms without departing from the scope and spirit of the present invention.

What is claimed is:

1. A light emitting diode backlight unit comprising:
a light source;
a board including a circuit pattern printed on an underside thereof, and having at least one mounting hole perforated therein where the light source is inserted;
a metal chassis having an inside surface on which an underside of the light source is mounted, and receiving the board to be arranged in parallel to and with a gap from the metal chassis; and
a reflector arranged on a top surface of the board to reflect light generated from the light source,
wherein the light source includes: a light emitting chip for generating light when a supply voltage is applied thereto, a heat conducting member wherein the light emitting chip is seated on a top surface thereof, a lead electrically connected to the light emitting chip, and a molding configured to integrally hold the heat conducting member and the lead; and
wherein the molding has a step formed in an upper outer periphery, the step configured to be fitted into the mounting hole.

2. The light emitting diode backlight unit according to claim 1, wherein the heat conducting member comprises a heat conductive metal exposed through an underside surface of the molding to be mounted on the inside surface of the metal chassis.

3. The light emitting diode backlight unit according to claim 1, wherein the lead comprises a lead terminal of a predetermined length with one end connected to the light emitting chip and the other end bent upward to be connected to the circuit pattern of the board.

4. The light emitting diode backlight unit according to claim 1, wherein the lead comprises an electrode terminal with one end connected to the light emitting chip and the other end connected to the circuit pattern on the underside of the board and exposed through an upper surface of the molding.

5. The light emitting diode backlight unit according to claim 1, further comprising a lens arranged on an upper portion of the molding.

6. The light emitting diode backlight unit according to claim 1, wherein the reflector comprises a reflective material coating of a predetermined thickness arranged on an upper surface of the board opposite to the underside thereof where the circuit pattern is printed.

7. The light emitting diode backlight unit according to claim 1, wherein the reflector comprises a reflective material deposition of a predetermined thickness arranged on an upper surface of the board opposite to the underside thereof where the circuit pattern is printed.

8. The light emitting diode backlight unit according to claim 1, wherein the reflector comprises a reflective material printing of a predetermined thickness arranged on an upper surface of the board opposite to the underside thereof where the circuit pattern is printed.

9. The light emitting diode backlight unit according to claim 1, wherein the reflector comprises a reflective sheet bonded via adhesive onto an upper surface of the board opposite to the underside thereof where the circuit pattern is printed.

10. The light emitting diode backlight unit according to claim 1, further comprising a liquid crystal display panel a diffuser sheet above the light source.

11. The light emitting diode backlight unit according to claim 10, further comprising a light guide plate between the light source and the diffuser sheet.

* * * * *